United States Patent
Mankos et al.

(10) Patent No.: US 6,538,256 B1
(45) Date of Patent: Mar. 25, 2003

(54) ELECTRON BEAM LITHOGRAPHY SYSTEM USING A PHOTOCATHODE WITH A PATTERN OF APERTURES FOR CREATING A TRANSMISSION RESONANCE

(75) Inventors: Marian Mankos, San Francisco, CA (US); Vidhya Krishnamurthi, Los Altos, CA (US); Kim Y. Lee, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/641,099

(22) Filed: Aug. 17, 2000

(51) Int. Cl.[7] ............... H01J 37/08; H01J 29/72; A61N 5/00
(52) U.S. Cl. ............... 250/492.24; 250/492.2; 250/396 R; 315/366
(58) Field of Search ............ 250/492.2, 492.24, 250/310, 492.1; 359/738; 315/366

(56) References Cited

U.S. PATENT DOCUMENTS

| | | | |
|---|---|---|---|
| 3,867,662 A | | 2/1975 | Endriz |
| 4,086,088 A | * | 4/1978 | Toepke .................. 96/1 R |
| 5,294,801 A | * | 3/1994 | Aton et al. ............ 250/492.22 |
| 5,684,360 A | * | 11/1997 | Baum et al. ................ 313/530 |
| 5,973,316 A | * | 10/1999 | Ebbesen et al. ............ 250/216 |
| 6,052,238 A | * | 4/2000 | Ebbesen et al. ............ 359/738 |
| 6,215,128 B1 | * | 4/2001 | Mankos et al. ......... 250/492.24 |

FOREIGN PATENT DOCUMENTS

| | | |
|---|---|---|
| EP | 0215532 | 3/1987 |
| GB | 2 111299 | 6/1983 |
| GB | 2 157884 | 10/1985 |
| WO | WO 9703453 | 1/1997 |
| WO | WO 0126134 | 4/2001 |

OTHER PUBLICATIONS

Sipe et al., "Surface–Plasmon–Assisted Photoemission", Journal of the Optical Society of America, American Institute of Physics, New York, US, vol. 71, No. 10, Oct. 1981, pp. 1286–1288, XP001031909.

Porto et al., "Transmission Resonances on Metallic Gratings with Very Narrow Slits", Physical Review Letters, vol. 83, No. 14, Oct. 1999, pp. 2845–2849, XP002183042, cited in application.

Ebbesen et al., "Extraordinary Optical Transmission Through Sub–wavelength Hole Arrays", Nature, vol. 391, Feb. 1998, pp. 667–669, XP002183043, cited in application.

Ghaemi et al., "Surface Plasmons Enhance Optical Transmission Through Subwavelength Holes", Physical Review B, vol. 58, No. 11, Sep. 1998, pp. 6779–6782, XP0021883044, cited in application.

* cited by examiner

Primary Examiner—Jack Berman
Assistant Examiner—Kalimah Fernandez
(74) Attorney, Agent, or Firm—Jung-hua Kuo (57) ABSTRACT

A method and system for electron beam lithography at high throughput with shorter electron beam column length, reduced electron-electron interactions, and higher beam current. The system includes a photocathode having a pattern composed of a periodic array of apertures with a specific geometry. The spacing of the apertures is chosen so as to maximize the transmission of the laser beam through apertures significantly smaller than the photon wavelength. The patterned photocathode is illuminated by an array of laser beams to allow blanking and gray-beam modulation of the individual beams at the source level by the switching of the individual laser beams in the array. Potential applications for this invention include electron beam direct write on wafers and mask patterning.

36 Claims, 9 Drawing Sheets

ELECTRON BEAM LITHOGRAPHY SYSTEM USING A PHOTOCATHODE WITH A PATTERN OF APERTURES FOR CREATING A TRANSMISSION RESONANCE

GOVERNMENT LICENSE RIGHTS

The U.S. Government has a paid-up license in this invention and the right in limited circumstances to require the patent owner to license others on reasonable terms as provided for by the terms of contract no. N00019-97-C-2010 awarded by the Naval Air Systems Command.

FIELD OF THE INVENTION

This invention pertains to the design of a high throughput electron beam lithography system based on an electron beam column equipped with a novel photocathode, which photocathode has a pattern composed of a periodic array of sub-wavelength apertures with a specific geometry for creating a transmission resonance.

BACKGROUND OF THE INVENTION

As encapsulated by Moore's Law, there is a longstanding trend in the semiconductor industry toward higher device densities and correspondingly smaller device geometries. One technique for coping with these decreasing device sizes is electron beam lithography in which electrons generated by an electron source are accelerated by an electric field and focused by electron optics onto a semiconductor substrate in order to expose an electron-sensitive resist coating on the substrate surface. Electron beam lithography has the advantage of being able to achieve much higher spatial resolution than light-based lithography.

In a conventional electron beam lithography system, a single beam in a single column is used to expose the resist and create the desired pattern. The throughput of a conventional electron beam lithography system is limited by the total beam current and data delivery rate. As the total beam current is increased, repulsive electron-electron interactions in the beam cause excessive blur, resulting in a degradation of the resolution of the written pattern. Increasing the length of the electron column also tends to increase the blur caused by the electron-electron interactions. Several approaches are known to reduce electron-electron interactions and the associated beam blur. When the total current is distributed evenly among several columns, a reduction in the beam blur of each column results in higher resolution, and if all the columns are operated in parallel, the throughput is not compromised. This is impractical for a conventional column due to its overall dimensions and large footprint. (in addition, the data delivery rate per column is reduced. For a given throughput, multiple beam approaches reduce the incrementing rate by the number of beamlets used.) In a single electron beam column, the total current can also be divided into several beamlets, which approach also reduces the blur due to electron-electron interactions and therefore allows a higher total beam current.

Electron lithography systems may also be divided into those in which one or more electron beams are selectively both modulated and moved over a semiconductor substrate in order to "directly write" a circuitry pattern in a serial manner without a mask, and those in which an electron emission pattern is created and electron-optically imaged onto a relatively large area of the substrate in order to expose a circuitry pattern in a concurrent manner. Such electron emission patterns may be created by illuminating a photocathode through an optical mask or by using a photocathode that incorporates a mask pattern into its own photoemissive structure. In the alternative, the electron emission pattern may also be defined by transmitting the electron beam through a mask or reticle.

When photocathodes are used to generate one or more electron beams for use in electron photolithography, it is desirable to be able to fabricate very small emission sites, since this reduces the required demagnification ratio. The optimum demagnification ratio is equal to the ratio of the source angle and the image angle at the substrate. Typical values are 2.5 mrad for the source angle, and 10 mrad for the image angle, which implies an optimum demagnification ratio of ¼. Given a spot size of 50 nm at the substrate, and optimum demagnification ratio of ¼, the size of the emission site should preferably be approximately 100 nm. Here we assume that the demagnified image and aberrations sum to the total spot size. For larger demagnification ratios, a part of the beamlet current must be cut out by the beam-limiting aperture, and therefore only a fraction of the emitted photoelectrons can be utilized for beam exposure. This requires a larger photoemission current at the photocathode, which increases blur induced by electron-electron interactions and therefore limits achievable throughput. Preferably, the size of the photoemission sites should be less than or equal to 100 nm. However, transmission through apertures substantially smaller than the shortest wavelength of practically available lasers (~250 nm) is very low. This means that the available photoemission current becomes negligible for such small aperture sizes.

The present invention involves a novel technique using a multiple electron beam column with a wavelength-period matched photocathode pattern for electron beam lithography. The transmission of this periodically patterned photocathode is anomalous, since it acts as an active element with a normalized transmission efficiency larger than 1; i.e., the light transmitted through the aperture is greater than the light directly impinging on it. (As used herein, "light" is not intended to be limited to wavelengths in the visible range.) This allows for the efficient illumination of sub-100 nm emission sites, therefore increasing the current available in each individual beamlet. As such, this arrangement allows high throughput to be achieved with very high spatial resolution lithography by simplifying and shortening the column, which reduces significantly the beam blur due to electron-electron interactions.

SUMMARY OF THE INVENTION

In a preferred embodiment, the invention is a method and apparatus for implementing sub-100 nm electron beam lithography at high throughput, and with an electron beam lithography column having a simplified design resulting in shorter column length, reduced electron-electron interactions and higher beam current.

In a class of embodiments, the invention is an electron beam lithography system based on an electron beam column having a novel photocathode, which photocathode has a pattern composed of a periodic array of apertures with a specific geometry. The spacing of the apertures is chosen so as to maximize the transmission of a laser beam through apertures significantly smaller than the photon wavelength. The patterned photocathode is illuminated by an array of laser beams to allow blanking and gray-beam modulation of the individual beams at the source level by the switching of the individual laser beams in the array. Potential applications for this invention include direct writing of a circuitry pattern on a target (e.g., a semiconductor wafer) using an electron beam, and mask patterning. In some applications, the electron beam is preferably a high voltage (50–100 kV) electron beam column; however the invention is also applicable to microcolumns operating at lower beam energies such as 1–5 kV.

BRIEF DESCRIPTION OF THE FIGURES

FIG. 1b is a cross-sectional view of the apparatus illustrated in FIG. 1a.

FIG. 2b is a cross-sectional view of the FIG. 2a photocathode taken along line 300—300 of FIG. 2a.

FIG. 3b is a cross-sectional view of the FIG. 3a photocathode taken along line 200—200 of FIG. 3a.

DETAILED DESCRIPTION OF THE INVENTION.

In the present invention, transmission resonances observed in periodic arrays of small, sub-wavelength apertures are applied to the particular problems associated with creating a suitable photocathode for electron beam lithography. Such transmission resonances are discussed in T. W. Ebbesen, H. J. Lezec, H. F. Ghaemi, T. Thio and P. A. Wolff, *Nature* 391, 667 (1998); H. F. Ghaemi, T. Thio, D. E. Grupp, T. W. Ebbesen, and H. J. Lezec, *Phys. Rev.* B 58, 6779 (1998); and J. A. Porto, F. J. Garcia-Vidal, and J. B. Pendry, *Phys. Rev. Lett.* 83, 2845, which papers are hereby incorporated by reference in their entireties.

The theoretical and experimental results discussed in the above-incorporated papers demonstrate that a periodic array of small apertures in a thin layer of metal transmits certain wavelengths surprisingly well. According to classical theory (H. A. Bethe, Phys. Rev. 66, 163 (1944)), the transmission efficiency of a single sub-wavelength aperture is predicted to scale as $(r/\lambda)^4$, where r is the aperture radius. This means that only a very small fraction of light should be transmitted through circular apertures that are only a fraction of a wavelength in diameter. (For apertures that are not circular in shape, the "size" of the aperture may be considered to be the diameter of the largest circle that can be fit entirely within the aperture.) However, for plasmon-mediated enhanced transmission, it has been shown that this is not the case. For example, one theoretical model predicts that for slits 0.5 $\mu$m wide and having a separation period (periodicity) of 3.5 $\mu$m, transmission resonance peaks begin to appear at characteristic wavelengths which exceed the separation period of the slits and accordingly are significantly larger than the width of the slits. In this model, incoming photons excite plasmons that transmit the energy through the slits and convert it back to photons on the opposite side of the metal film. Remarkably, experiments with two-dimensional arrays of apertures have shown resonance peaks in which the normalized transmission efficiency for a periodic array of sub-wavelength holes (found by dividing the fraction of the light transmitted by the fraction of surface area occupied by the holes) is greater than unity. In other words, in these experiments, more light is transmitted through the holes than impinges directly on the holes.

The geometry of the aperture array is a key factor controlling the transmission properties of the metal film. In particular the spectral locations of the resonance peaks for light transmittance through such an array are strongly dependent on the periodicity a of the array. For example, one group of experiments suggests that the dispersion for surface plasmons responsible for transmission resonance peaks in a given metal layer may be related to the geometry of a square array of apertures present in the layer by the following equation:

$$K_{sp} = K_x \pm iG_x \pm jG_y \qquad (1)$$

Here $K_{sp}$ is the wavevector for the surface plasmon; $K_x$ is the component f the incident photon's wavevector in the xy-plane defined by the metal layer and is zero when the incidence is normal to the metal layer; $G_x$ and $G_y$ are the momentum wavevectors associated with the square array of apertures with their magnitudes both given by $2\pi/a$; a is the periodicity for the array; and i and j are integers. The magnitude of $K_{sp}$ may depend on at least the wavelength of the incident light, the dielectric constant of the metal, the geometry of the array, and the dielectric constant of the interface medium at the surface of the metal layer on which the surface plasmon is excited. (For example, where the metal layer is deposited on top of a dielectric substrate, the interface medium will be the dielectric substrate for surface plasmons excited on one side of the metal layer and air for surface plasmons excited on the other side of the metal layer.) An approximate formula for the magnitude of $K_{sp}$ which ignores the presence of the array of apertures is given by:

$$|K_{sp}| = (2\pi/\lambda)(\epsilon_1 \epsilon_2/(\epsilon_1 + \epsilon_2))^{1/2} \qquad (2)$$

Here $\lambda$ is the wavelength of the incident light; $\epsilon_1$ is the dielectric constant of the interface medium; and $\epsilon_2$ is the real part of the dielectric constant of the metal. In the case where the light is normally incident to the metal, $K_x$ is zero and equation (1) implies a magnitude of $(2\pi/a)(i^2+j^2)^{1/2}$ for $K_{sp}$. Equating this magnitude value with the magnitude value given by equation (2) and solving for the periodicity a gives an approximate formula for the square array periodicities that yield transmission resonances for a given wavelength $\lambda$ of normally incident light.

$$a(\lambda, \epsilon_1, \epsilon_2, i, j) = \lambda (i^2+j^2)^{1/2}((\epsilon_1+\epsilon_2)/(\epsilon_1 \epsilon_2))^{1/2} \qquad (3)$$

As the above equations reflect, the spectral locations of the resonance peaks for light transmittance through a periodic sub-wavelength array are strongly dependent on the periodicity a of the array. Because the geometry of the aperture array largely controls the spectral locations of the resonance peaks for a given metal layer and angle of incidence, it is possible to effectively "tune" a metal aperture array to select a particular wavelength for transmission by choosing an array geometry that yields a resonance peak at that particular wavelength. Equation (3) can aid in constructing such metal aperture arrays, since it may be used to estimate a value of the periodicity a that will give a resonance peak for a desired wavelength $\lambda$ of normally incident light.

While the existence of these transmission resonances does not appear to critically depend on the choice of metal (e.g., Ag, Cr, Au, Ti, Rh, Ru, Pt etc.), the presence of metal itself is crucial: no enhanced transmission has been observed for arrays fabricated in Ge. The transmission efficiency of light has also been observed to decrease as the thickness of the metal layer increases.

Figure 1A:
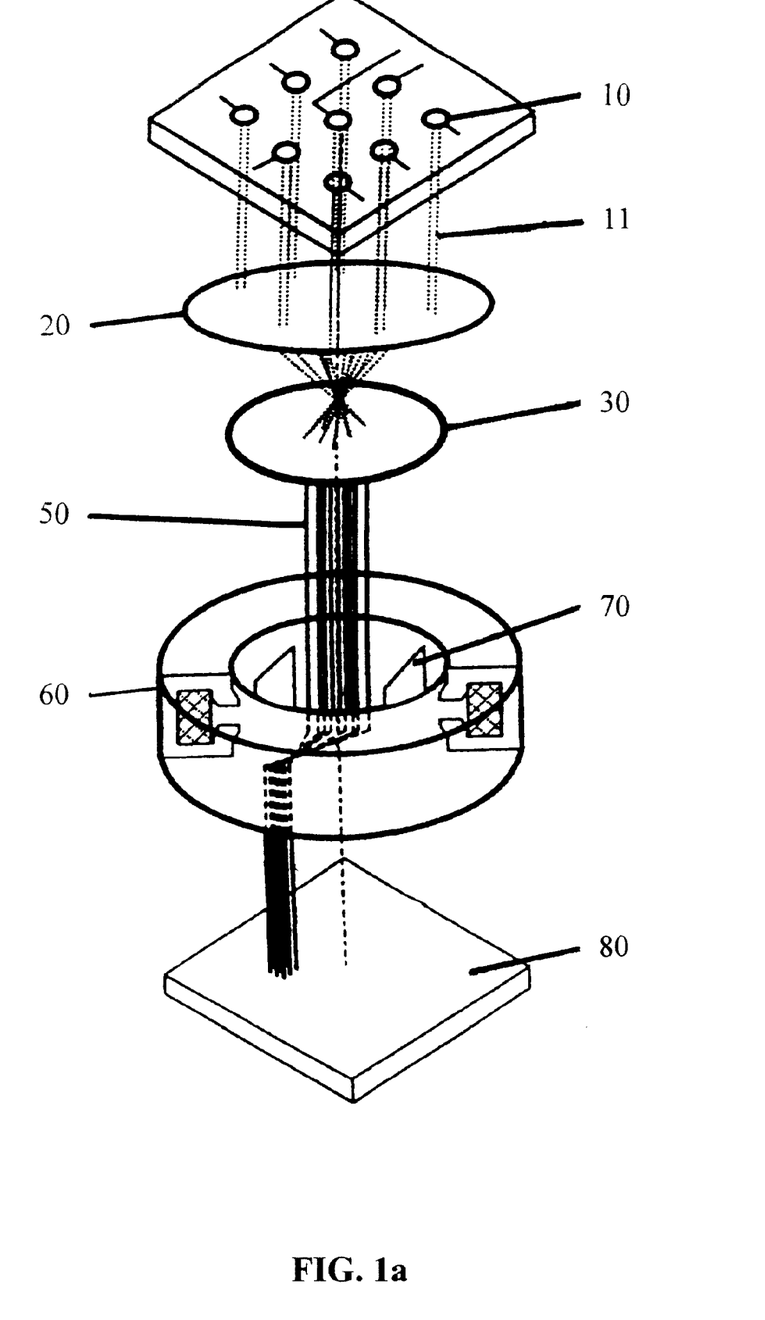
FIG. 1a is a perspective view of an embodiment of a portion of an electron beam lithography apparatus according to the present invention.
Figure 1B:
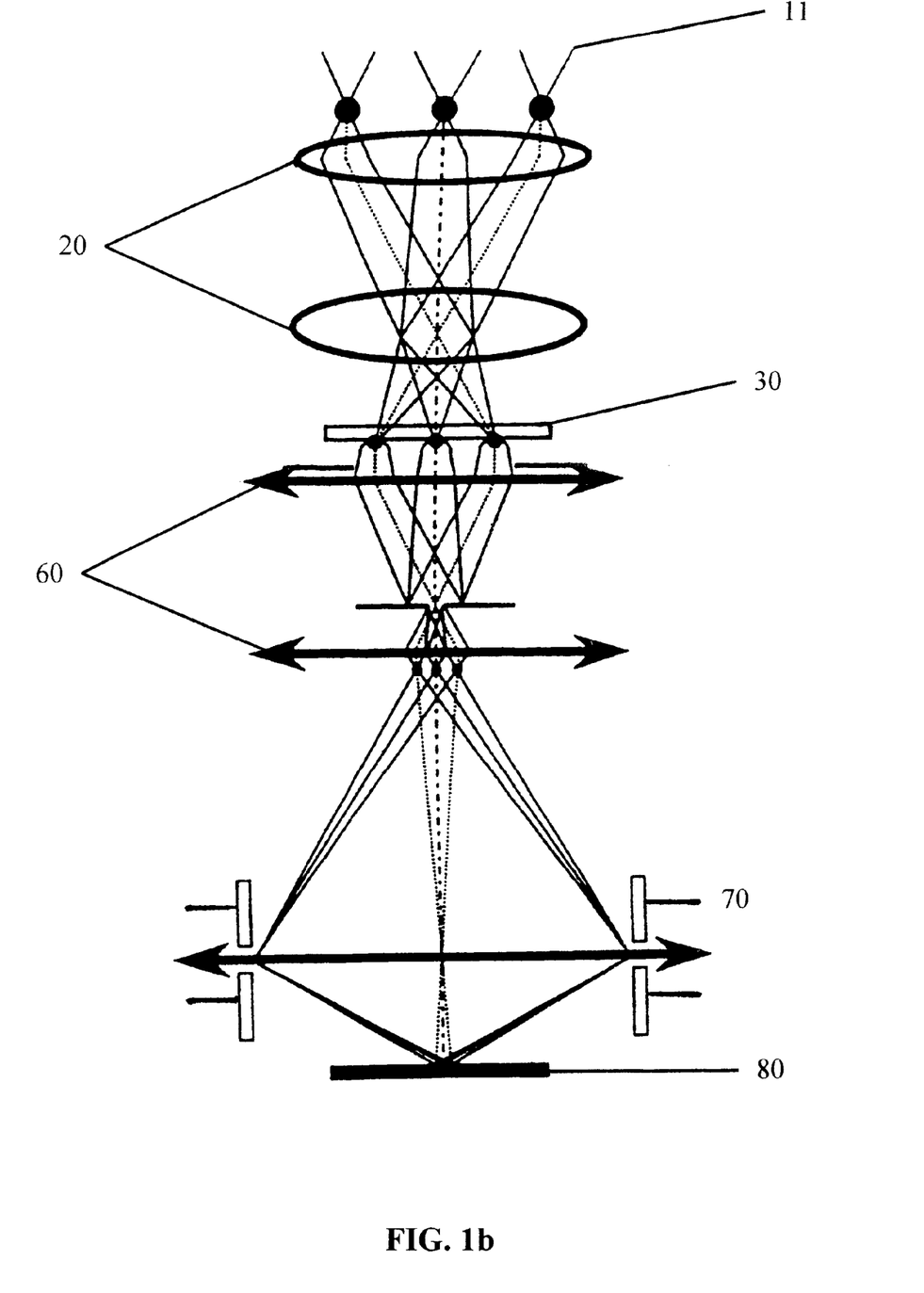
Figure 3A:
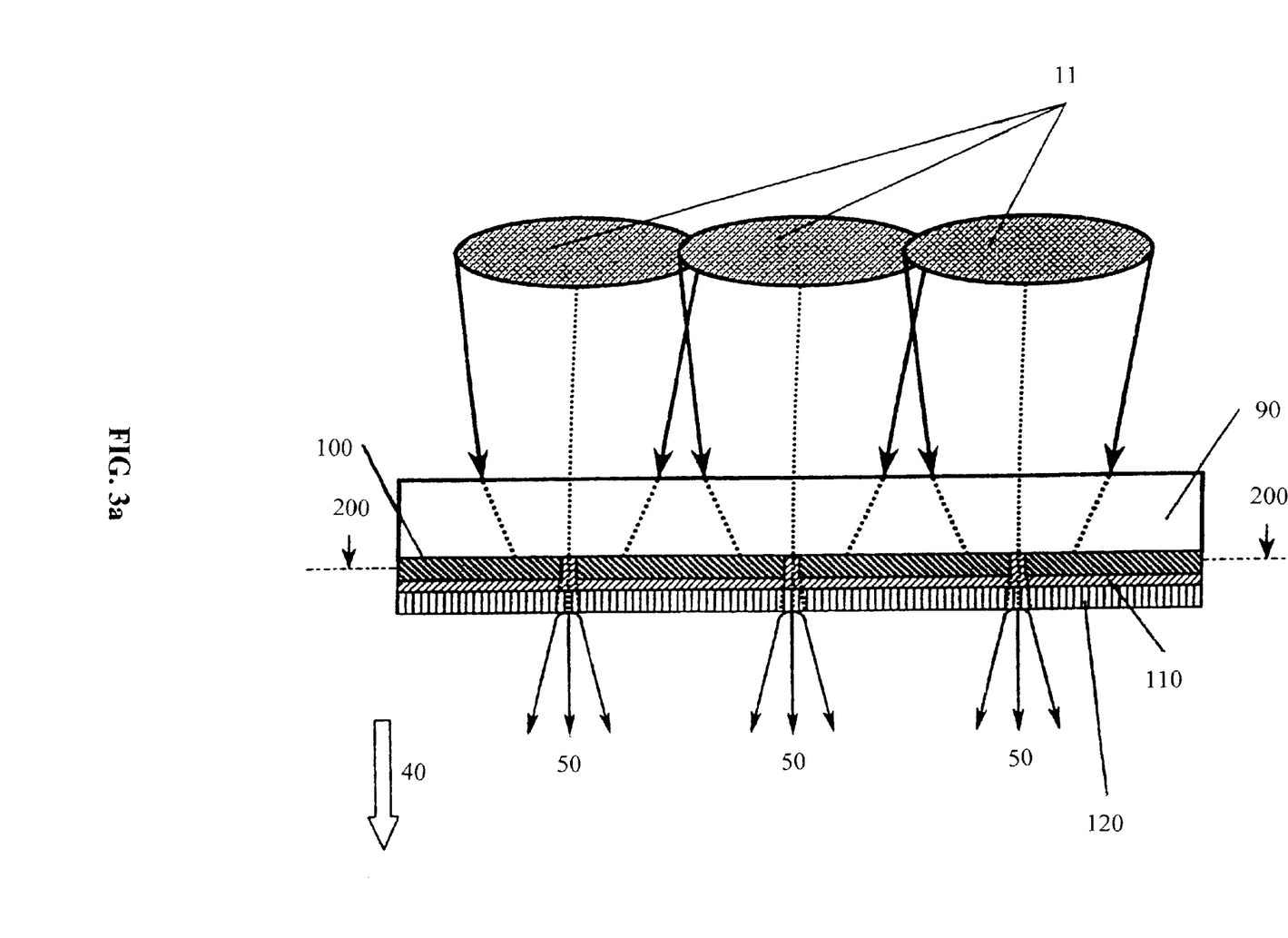
FIG. 3a is a cross-sectional view of a first photocathode according the present invention.
Figure 3B:
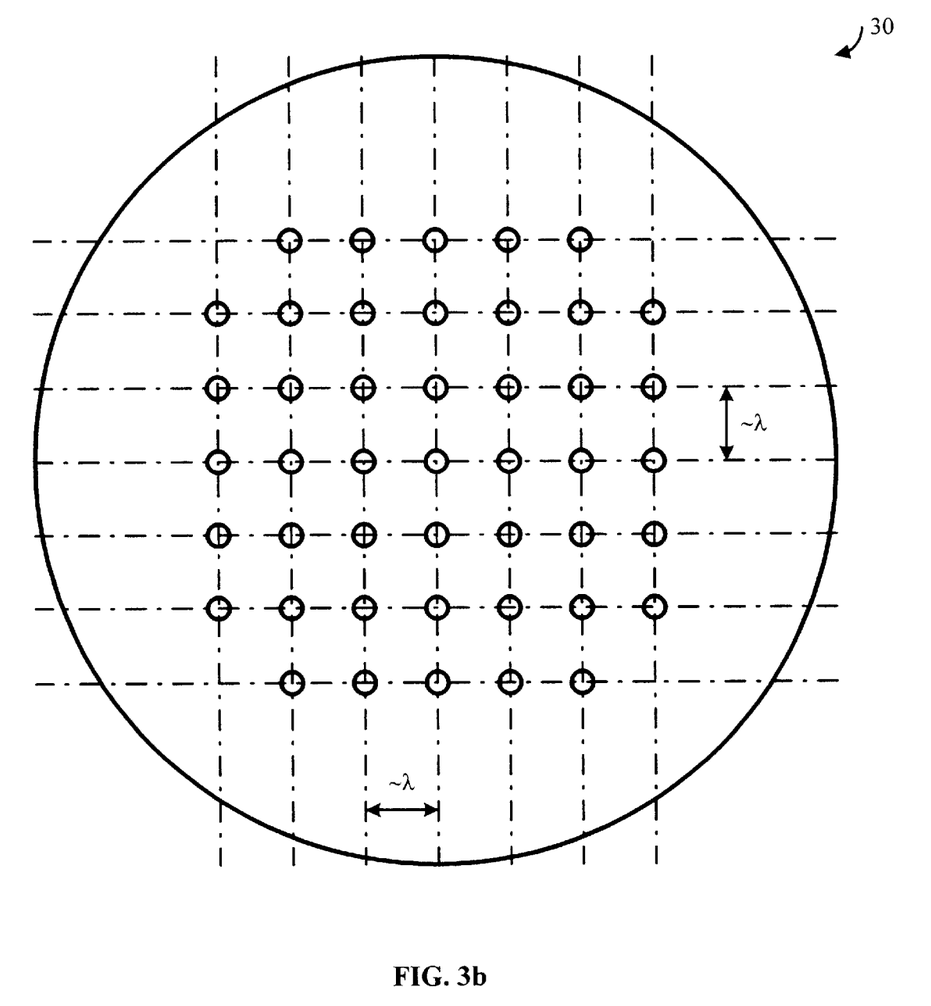

Two views of an embodiment of the present invention are shown in FIGS. 1a and 1b. An array of individually blanked laser beams 11 are generated by an array of lasers 10 (e.g. a vertical cavity surface emitting laser (VCSEL) array). Alternatively, a laser could be used in combination with a beam splitter. The laser beams 11 from the arrays of lasers 10 are demagnified by an optical system 20 consisting of one or more optical lenses and focused onto the back side of the photocathode 30. As shown in FIGS. 3a and 3b, the photocathode 30 is fabricated on a substrate 90 (e.g. fused silica, quartz, sapphire or diamond) and has a patterned aperture array structure on the front side. The patterned aperture array structure consists of a periodically patterned metal layer 100, a thin layer of insulating dielectric 110 ($SiO_2$, etc.), and a photoemissive layer 120. Examples of suitable photoemissive materials for the photocathode are cesiated GaAs and silicon-cesium oxide in the case of negative electron affinity photocathodes ("NEA" cathodes), and $Cs_2$ Te. U.S. Pat. No. 5,684,360, hereby incorporated by reference in its entirety, discloses a suitable type of NEA photocathode. NEA cathodes can be used with commercially available laser diode arrays or VCSELs of longer wavelengths (700 nm), while the CsTe photocathodes require a shorter wavelength laser (~300 nm). Each individual laser beam is preferably focused to the smallest possible beam diameter and is centered on one aperture or array of apertures, the diameter of which is a fraction (~⅓ to ⅒) of the laser wavelength. For example, for a commercially available 257 nm frequency-doubled argon ion laser (the FRED Innova laser made by Coherent), a beam diameter of 300 nm is achievable, making an aperture diameter of 30–100 nm suitable. For another commercially available 635 nm semiconductor laser, a beam diameter of 700 nm is achievable, in which case an aperture diameter of 70–100 nm is suitable. The apertures form a regular array optimized for plasmon-mediated enhanced transmission.

Figure 2A:
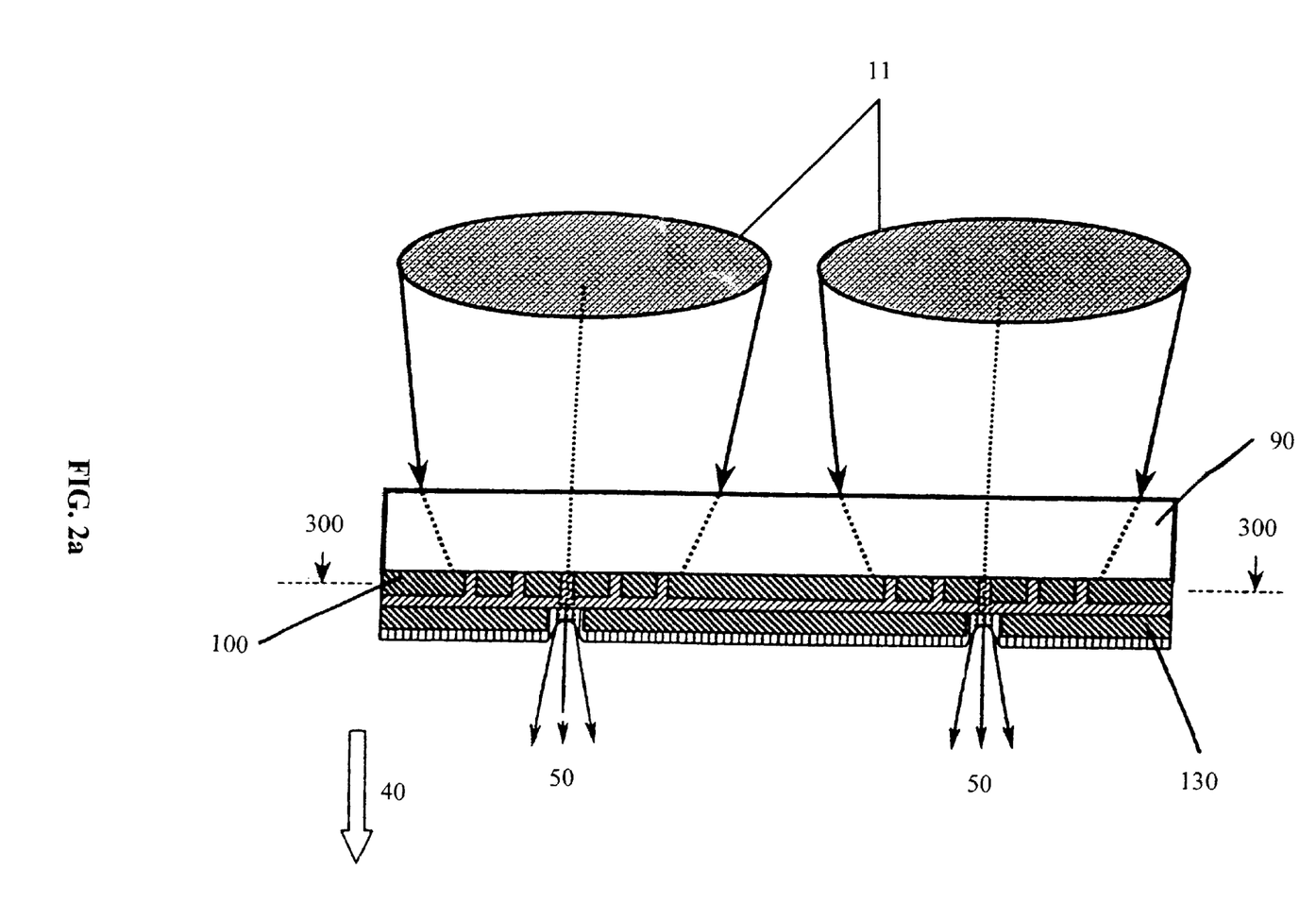
FIG. 2a is a cross-sectional view of a second photocathode according the present invention.
Figure 2B:
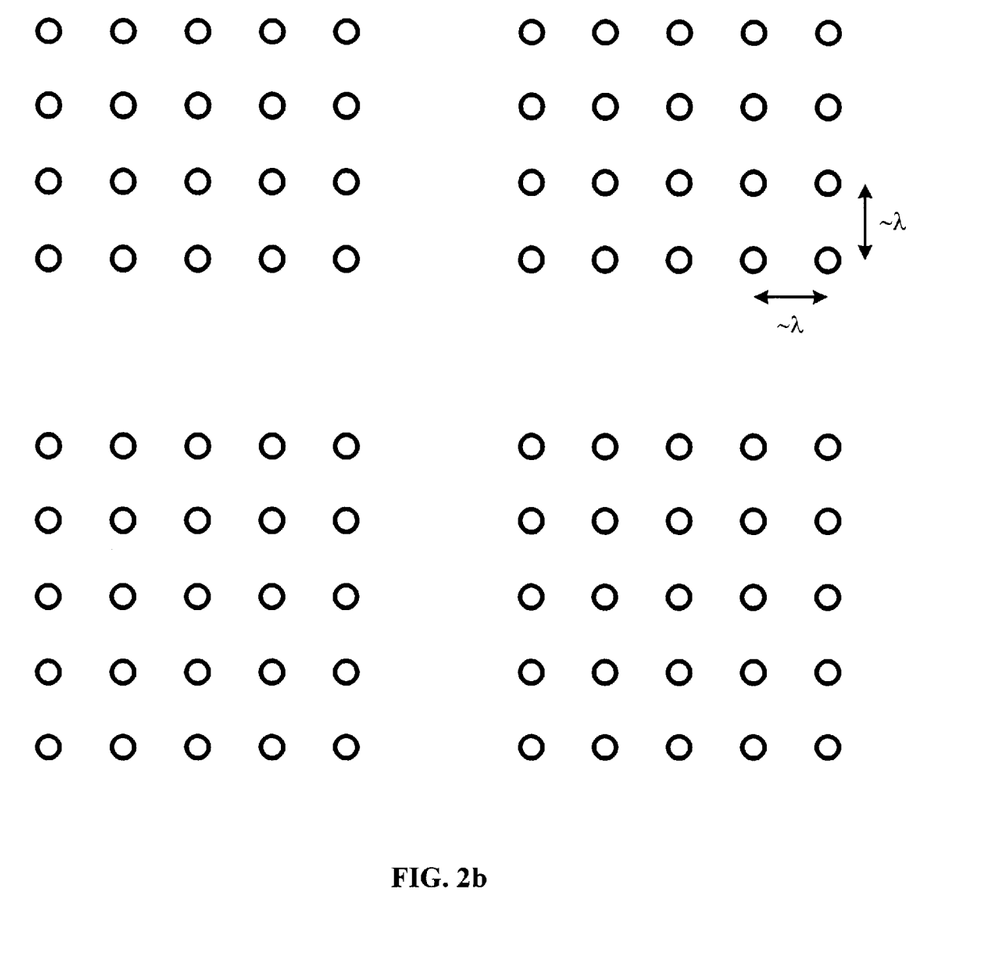

One embodiment geometry is shown in FIGS. 2a and 2b, in which an array of aperture subarrays is illuminated by an array of independently modulated beams. The aperture subarrays are regularly spaced in a rectangular array. This allows large spacings between the individual laser beams to be used, which can simplify the design of the laser optics. All individual aperture subarrays are identical, consisting of an array of apertures that have a diameter small compared to the wavelength of the used laser light and that are regularly spaced in a square array with a separation period with a period that is selected to yield a transmission resonance for the wavelength of the light being applied. (As used herein the phrase "periodic array" is meant to be broad enough to encompass such a subarray and is not meant to imply that the periodic array must cover the entire surface of the target area.) This embodiment requires an additional blocking chrome layer 130 in order to eliminate the photoemission from all but the central aperture in the subarray.

Figure 2C:
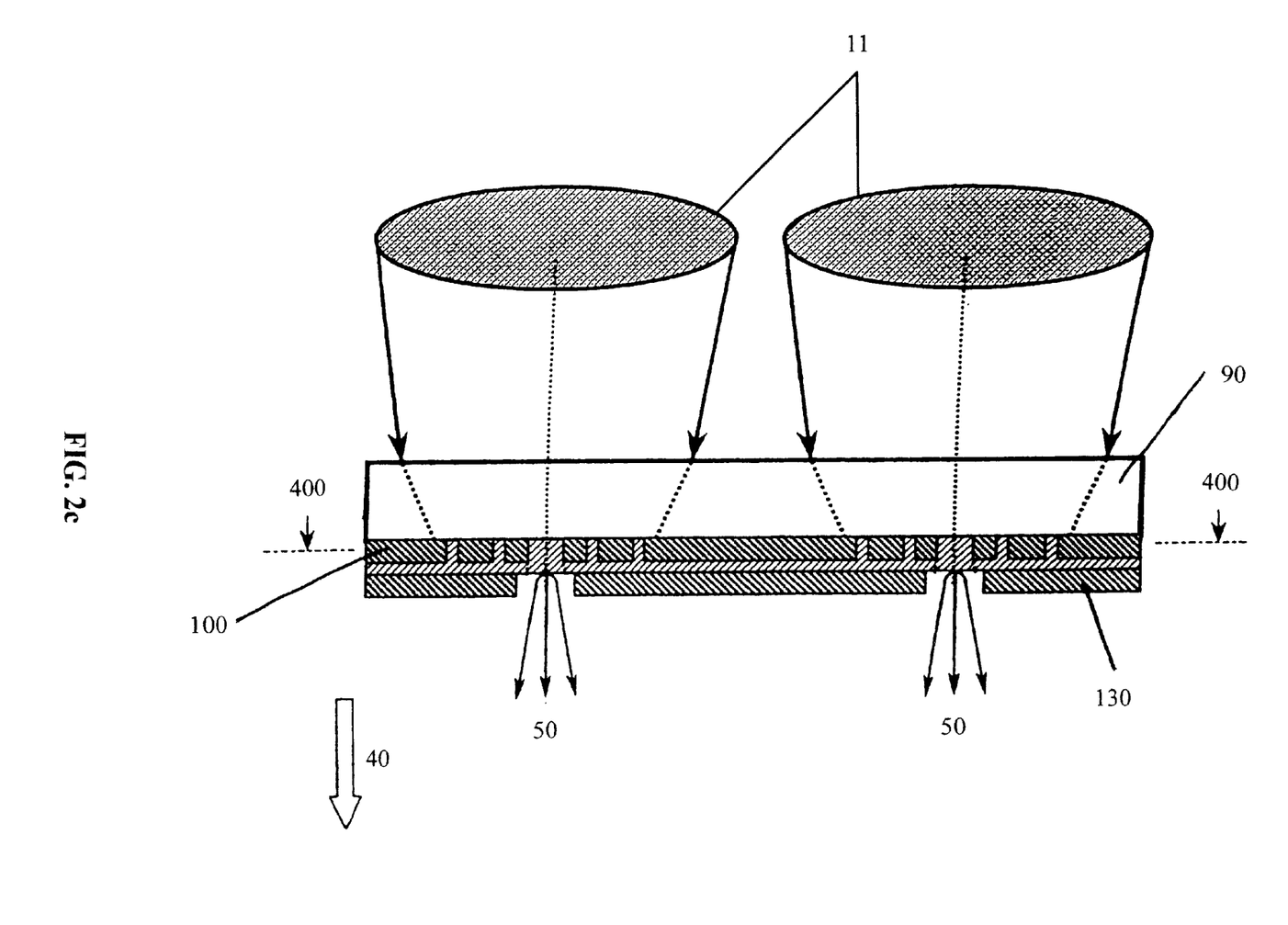
FIG. 2c is a cross-sectional view of a third photocathode according the present invention.
Figure 2D:
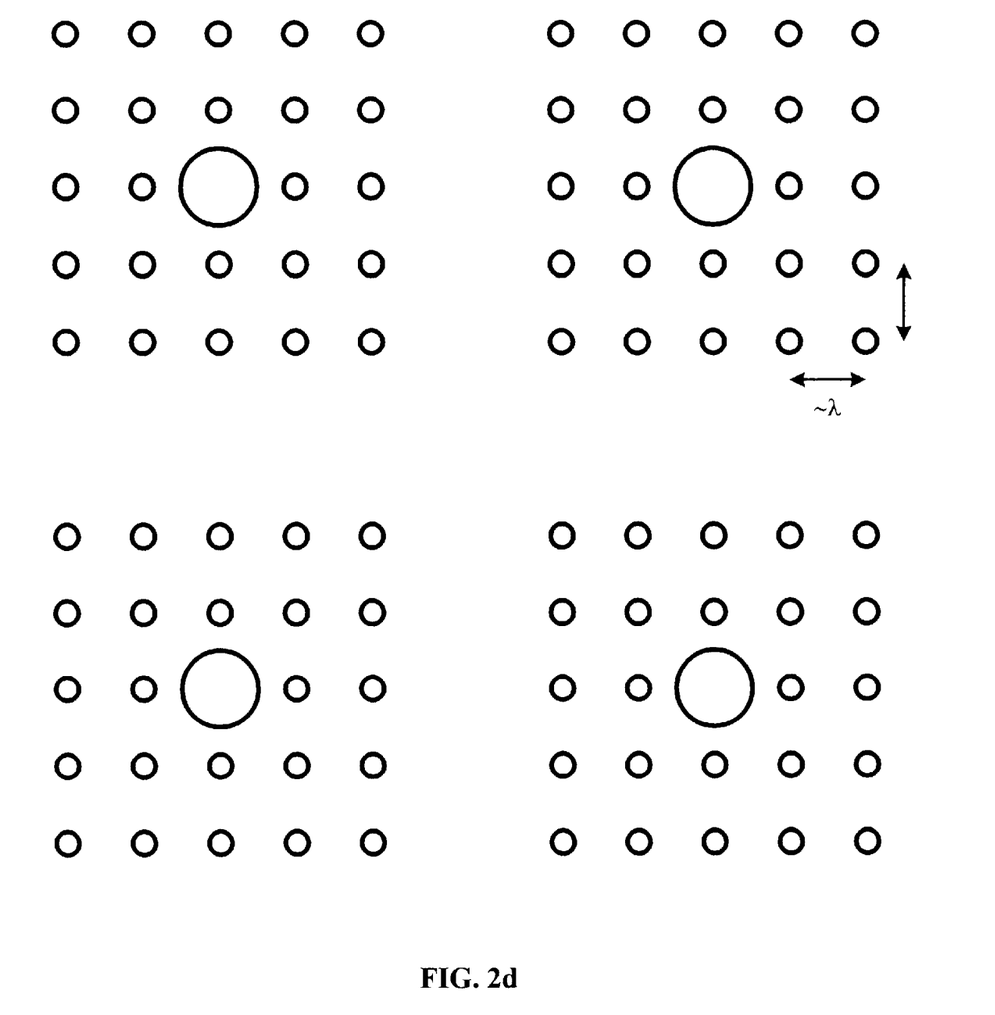
FIG. 2d is a cross-sectional view of the FIG. 2c photocathode taken along line 400—400 of FIG. 2c.

An alternative embodiment of an array of aperture subarrays illuminated by an array of independently modulated beams is shown in FIGS. 2c and d. The aperture subarrays are regularly spaced in a rectangular array with an arbitrary period independent of the wavelength of the applied light, which again allows larger spacings between the individual laser beams to be used, thereby simplifying the laser optics design. In this case, all individual apertures in each subarray are identical except the central aperture, which has a larger diameter in order to allow for increased transmission compared to the other apertures of the subarray.

Again, each aperture subarray consists of apertures that have a diameter small compared to the wavelength of the applied laser light and that are regularly spaced in a rectangular array with a separation period that is suitably matched to the wavelength of the applied light. This embodiment again requires an additional blocking chrome layer 130 in order to eliminate the photoemission from all but the central aperture in the subarray.

Another embodiment geometry is shown in FIGS. 3a and 3b, in which an array of sub-wavelength apertures is illuminated by an array of independently modulated beams. The apertures are regularly spaced in a square array with a separation period that is selected to yield a transmission resonance at the wavelength of the laser light. An example of suitable array configuration for a laser wavelength of 257 nm would be one with an aperture diameter of 30 nm, an aperture spacing of 250 nm, and a film thickness of 150 nm. Other geometric arrangements of the aperture array are possible. Examples include square, hexagonal, and linear arrays having a separation period suitably matched to the wavelength of the light being applied. In this geometry, it may be necessary to fabricate an aperture array larger than the laser beam array, thus providing a periodic environment for each individual beam. In this case, only the central portion of the array is illuminated.

In all of the above embodiments, the incoming photons excite plasmons which transmit the energy through the aperture and convert it back to photons on the opposite side of the metal film. The transmitted and enhanced photon beam is absorbed in the photocathode layer and excites electrons there. A portion of the electrons which do not lose enough energy (while scattering within the photocathode layer itself) is emitted into the vacuum. When a voltage (up to 100 kV) is applied to the extraction electrode, the photoelectrons 50 are accelerated by an electric field 40. The photoeletrons 50 create a multibeam pattern that is a photoemission image of the pattern on the photocathode surface. Suitable electron optics 60 are used to focus the multibeam pattern and thereby project a demagnified image onto the surface of the target 80, which surface lies in a writing plane. Such electron optics 60 may take the form of magnetic lenses, electrostatic lenses, or a combination thereof. U.S. Pat. Nos. 6,002,135 and 5,729,022, hereby incorporated by reference in their entireties, disclose the use of such magnetic lenses as well as the use of a magnetic deflector assembly, while U.S. Pat. Nos. 5,196,707 and 4,683,366, hereby incorporated by reference in their entireties, discloses the use of such electrostatic lenses.

A deflector system 70 serves to accurately position the focused multibeam pattern on the writing plane. Such a deflection system 70 may take the form of magnetic deflection coils. In addition to the 6,002,135 and 5,729,022 patents incorporated above, U.S. Pat. Nos. 5,012,104 and 5,136,166 disclose such magnetic deflection assemblies and are hereby incorporated by reference in their entireties.

By means of the electron optics 60 and deflection system 70, the electron beam pattern is further demagnified and scanned across the writing plane. The beam blanking and modulation is implemented electronically at the laser level, which significantly simplifies the design of the electron lithography system. No additional blanking apertures and drift spaces are required, which minimizes the column length. This minimal column length in turn minimizes the electron-electron interactions and maximizes achievable throughput. For a combined laser and beam splitter, the individual beams are modulated by acousto-optic modulators. In the case of a VCSEL array, the modulation of the photon intensity may preferably be achieved by applying a dc voltage to the individual VCSELs. Techniques for writing complex lithographic patterns by modulating and moving an electron beam are disclosed in U.S. Pat. Nos. 5,959,606; 5,876,902; 5,103,101; and 5,847,959, each of which is hereby incorporated by reference in its entirety.

Figure 4A:
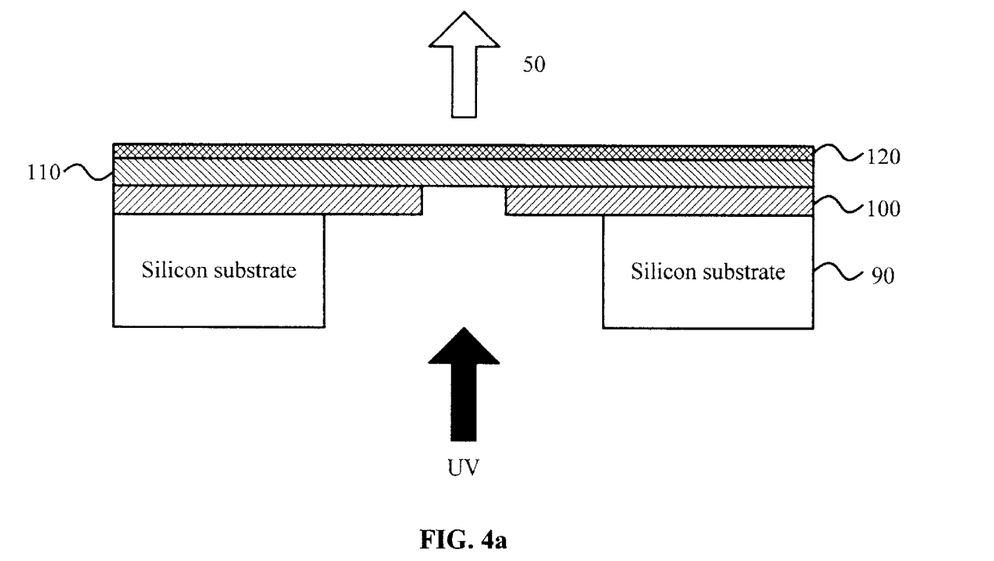
FIGS. 4a and 4b illustrate methods of fabricating photocathodes according the present invention.

The patterned aperture array structure may be fabricated using conventional semiconductor processing techniques. Several processing techniques can be used to pattern the wavelength-period matched photocathode pattern. In one processing technique shown in FIG. 4a, a thin layer of chrome 100 (~100–200 nm) is deposited on a thick silicon substrate 90. The light-blocking chrome layer 100 is then patterned using electron lithography techniques in order to make a regular array of, for example, ~50 nm holes spaced about 300 nm apart (i.e., a separation period suitably matched to the laser wavelength). Then a thin insulating layer 110 (100–200 nm thick layer of Pyrex glass or $SiO_2$) is deposited on the chrome. In the case of a metal photocathode like gold, there could be an additional step of adding a thin titanium layer between the insulating layer and photoemissive layer for better adhesion. In the case of semiconductor photocathodes like $Cs_2Te$, an additional thin conductive layer (~1–10 nm) of molybdenum, chrome or titanium is used to provide electrical contact and to minimize the resistance across the photoemitter. Photoemissive material 120 is then deposited on top of this very thin layer. The last step in the process would be patterning the backside of the silicon so as to make a hole in the substrate large enough to accommodate the entire patterned photocathode.

Figure 4B:
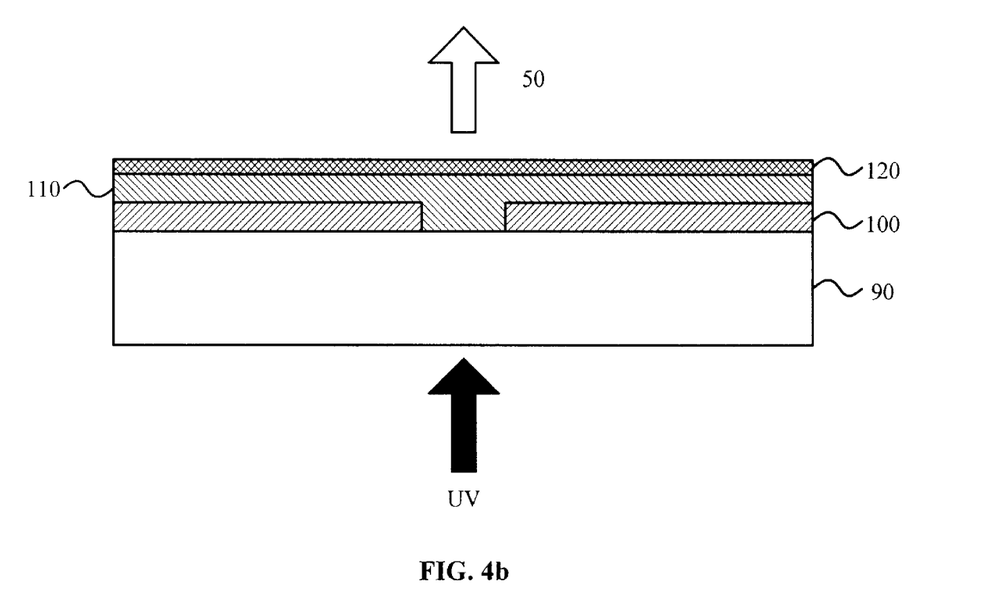

In another suitable processing technique shown in FIG. 4b, a thin blocking layer of chrome 100 (~100–200 nm) is deposited on a thick substrate 90 (sapphire, fused silica, quartz or diamond) and patterned using electron-lithographic techniques, followed by plasma-enhanced chemical vapor deposition (PECVD) of an insulating layer 110 of silicon dioxide, silicon nitrate or silicon oxynitrite. This step would be followed by the deposition of the photoemissive material 120 of choice. Again, in the case of metals like gold, a very thin titanium layer would precede the gold deposition in order to improve adhesion. Similarly, in the case of semiconductor photocathodes like $Cs_2Te$, an additional thin conductive layer (~1–10 nm) of molybdenum, chrome or titanium is used as above to provide electrical contact.

The scope of the present invention is meant to be that set forth in the claims that follow and equivalents thereof, and is not limited to any of the specific embodiments described above.

What is claimed is:

1. A method of generating one or more electron beams comprising the steps of:
    generating one or more monochromatic light beams having a characteristic wavelength; and
    directing said one or more light beams onto a metal layer which defines a periodic array of apertures having a separation period, said periodic array of apertures being such that the size of each of said apertures is smaller than said characteristic wavelength and further being such that the separation period of said periodic array of apertures is chosen so as to enhance the transmission of said one or more light beams through said metal layer, so that radiation of said one or more light beams transmitted through said apertures impinges upon a photoemissive material so that one or more electron beams are generated.

2. A method as recited in claim 1 further comprising the step of directly writing a pattern on a target using said one or more electron beams.

3. A method as recited in claim 1 wherein said step of generating one or more light beams includes generating an array of laser beams.

4. A method as recited in claim 1 wherein said step of generating one or more light beams includes generating an array of laser beams, and further comprising the step of directly writing a pattern on a target using said one or more electron beams.

5. A method as recited in claim 4 wherein said direct writing step includes controlling said one or more electron beams by individually modulating each laser beam in said array of laser beams.

6. A method as recited in claim 4 wherein said target is a semiconductor wafer or photomask and said pattern defines circuitry features.

7. A method as recited in claim 1 wherein said directing step includes focusing said one or more light beams onto said metal layer.

8. A method as recited in claim 1 further comprising the step of focusing said one or more electron beams onto a target using electron optics.

9. A method as recited in claim 8 further comprising the step of directly writing a pattern on said target using said one or more electron beams.

10. A method as recited in claim 8 wherein said step of generating one or more light beams includes generating an array of laser beams.

11. A method as recited in claim 8 wherein said step of generating one or more light beams includes generating an array of laser beams, and further comprising the step of directly writing a pattern on the target using said one or more electron beams.

12. A method as recited in claim 11 wherein said direct writing step includes controlling said one or more electron beams by individually modulating each laser beam in said array of laser beams.

13. A method as recited in claim 11 wherein said target is a semiconductor wafer or photomask and said pattern defines circuitry features.

14. A method of generating one or more electron beams for use in electron beam lithography comprising the steps of:
    generating one or more monochromatic light beams having a characteristic wavelength;
    focusing said one or more light beams onto a metal layer which defines a periodic array of apertures having a separation period, said periodic array of apertures being such that the size of each of said apertures is smaller than said characteristic wavelength and further being such that the separation period of said periodic array of apertures is chosen so as to enhance the transmission of said one or more light beams through said metal layer, so that radiation of said one or more light beams transmitted through said apertures impinges upon a photoemissive material so that one or more electron beams are generated; and
    focusing said one or more electron beams onto a target using electron optics.

15. A method as recited in claim 14 further comprising the step of directly writing a pattern on said target using said one or more electron beams.

16. A method as recited in claim 14 wherein said step of generating one or more light beams includes generating an array of laser beams.

17. A method as recited in claim 14 wherein said step of generating one or more light beams includes generating an array of laser beams, and further comprising the step of directly writing a pattern on the target using said one or more electron beams.

18. A method as recited in claim 17 wherein said direct writing step includes controlling said one or more electron beams by individually modulating each laser beam in said array of laser beams.

19. A method as recited in claim 17 wherein said target is a semiconductor wafer or photomask and said pattern defines circuitry features.

20. An apparatus for generating one or more electron beams comprising:

means for generating one or more monochromatic light beams having a characteristic wavelength; and a photocathode for generating said one or more electron beams, positioned to receive said one or more light beams, said photocathode including:

a metal layer which defines a periodic array of apertures having a separation period, said periodic array of apertures being such that the size of each of said apertures is smaller than said characteristic wavelength and further being such that the separation period of said periodic array of apertures is chosen so as to enhance the transmission of said one or more light beams through said metal layer; and a photoemissive material positioned to receive light transmitted through said metal layer and to generate said one or more electron beams in response thereto.

21. An apparatus as recited in claim 20 further comprising means for directly writing a pattern on a target using said one or more electron beams.

22. An apparatus as recited in claim 20 wherein said means for generating one or more light beams includes an array of laser beam sources.

23. An apparatus as recited in claim 20 wherein said means for generating one or more light beams includes an array of laser beam sources, and further comprising means for directly writing a pattern on a target using said one or more electron beams.

24. An apparatus as recited in claim 23 wherein said means for directly writing includes means for controlling said one or more electron beams by individually modulating each laser beam in said array of laser beams.

25. An apparatus as recited in claim 23 wherein said target is a semiconductor wafer or photomask, said pattern defines circuitry-features, and said means for directly writing is configured to write said pattern on the semiconductor wafer or photomask.

26. An apparatus as recited in claim 20 further comprising means for focusing said one or more light beams onto said photocathode.

27. An apparatus as recited in claim 20 wherein said photocathode further includes a dielectric layer between said metal layer and said photoemissive material.

28. An apparatus as recited in claim 27 wherein said photocathode includes a substrate in contact with said metal layer such that the metal layer is between the substrate and the dielectric layer.

29. An apparatus as recited in claim 20 further comprising electron optics for focusing said one or more electron beams onto a target.

30. An apparatus as recited in claim 29 further comprising means for directly writing a pattern on the target using said one or more electron beams.

31. An apparatus as recited in claim 29 wherein said means for generating one or more light beams includes an array of laser beam sources.

32. An apparatus as recited in claim 29 wherein said means for generating one or more light beams includes an array of laser beam sources, and further comprising means for directly writing a pattern on the target using said one or more electron beams.

33. An apparatus as recited in claim 32 wherein said means for directly writing includes means for controlling said one or more electron beams by individually modulating each laser beam in said array of laser beams.

34. An apparatus as recited in claim 32 wherein said target is a semiconductor wafer or photomask, said pattern defines circuitry features, and said means for directly writing is configured to write said pattern on the semiconductor wafer or photomask.

35. An apparatus as recited in claim 20 further comprising:

means for focusing said one or more light beams onto said photocathode; and electron optics for focusing said one or more electron beams onto a target to accomplish electron beam lithography as a result of interaction between the one or more electron beams and the target.

36. An apparatus as recited in claim 35 wherein said target is a semiconductor wafer or photomask.

* * * * *